US010958259B2

(12) United States Patent
Tsao et al.

(10) Patent No.: US 10,958,259 B2
(45) Date of Patent: Mar. 23, 2021

(54) PULSE WIDTH MODULATION OUTPUT STAGE WITH DEAD TIME CONTROL

(71) Applicant: ELITE SEMICONDUCTOR MEMORY TECHNOLOGY INC., Hsinchu (TW)

(72) Inventors: Szu-Chun Tsao, Hsinchu (TW); Yang-Jing Huang, Hsinchu (TW); Ya-Mien Hsu, Hsinchu (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 0 days.

(21) Appl. No.: 16/837,634

(22) Filed: Apr. 1, 2020

(65) Prior Publication Data

US 2020/0389161 A1 Dec. 10, 2020

(30) Foreign Application Priority Data

Jun. 4, 2019 (TW) .................................. 108119647

(51) Int. Cl.
*H03K 7/08* (2006.01)
(52) U.S. Cl.
CPC ..................................... *H03K 7/08* (2013.01)

(58) Field of Classification Search
CPC ........................................................ H03K 7/08
See application file for complete search history.

(56) References Cited

U.S. PATENT DOCUMENTS

| 8,749,209 | B2* | 6/2014 | Feldtkeller | H02M 3/1563 323/224 |
|---|---|---|---|---|
| 10,230,311 | B2* | 3/2019 | Chen | G01K 13/00 |
| 10,348,293 | B2* | 7/2019 | Abesingha | H03K 17/284 |
| 2018/0131282 | A1* | 5/2018 | Chen | H02M 1/38 |

* cited by examiner

*Primary Examiner* — Patrick O Neill
(74) *Attorney, Agent, or Firm* — Juan Carlos A. Marquez; Marquez IP Law Office, PLLC

(57) ABSTRACT

A pulse width modulation output stage incorporates a half bridge output stage, a gate control circuit, a detection circuit, and a control logic. The half bridge output stage has a first transistor and a second transistor connected in series between a power supply node and a ground node. The gate control circuit outputs a pulse width modulation signal to drive the first transistor and the second transistor. The detection circuit detects whether or not a glitch occurs in one of the gate voltages of the first and second transistor so as to generate a control code. The logic circuit varies the delay time of the pulse width modulation signal based on the control code.

13 Claims, 14 Drawing Sheets

PULSE WIDTH MODULATION OUTPUT STAGE WITH DEAD TIME CONTROL

BACKGROUND OF THE INVENTION

1. Field of the Invention

The present invention generally relates to a pulse width modulation (PWM) output stage with dead time control.

2. Description of the Related Art

Dead time control is important for a half bridge output stage. The half bridge outputs stage has a high side switching transistor and a low side switching transistor connected between a ground node and a supply voltage node. The dead time control can avoid cross-conduction across the high side switching transistor and the low side switching transistor. If cross-conduction occurs, there will be a voltage shoot-through through transistors, which can damage the transistors and other components within and around the half bridge outputs stage.

However, traditional dead time control is implemented with several simple logic gates, and thus the dead time is a constant time interval and is unable to be changed. Since the dead time may be affected by the process and supply voltage variation, it would be desirable to provide an adaptive dead time control circuit.

SUMMARY OF THE INVENTION

One aspect of the present invention is a PWM output stage with dead time control.

According to one embodiment of the present invention, the PWM output stage comprises a half bridge output stage, a gate control circuit, a detection circuit, and a control logic. The half bridge output stage comprises a first transistor and a second transistor connected in series between a power supply and a ground node. The gate control circuit is configured to output a PWM signal for driving the first transistor and the second transistor. The detection circuit is configured to detect if a glitch event occurs in a gate voltage of one of the first transistor and second transistor when the second transistor is in an off state, and generate a set of control codes according to the detection. The control logic is configured to change delay time of the PWM signal according to the set of control codes.

Another aspect of the present invention is a PWM output stage with dead time control.

According to one embodiment of the present invention, the PWM output stage comprises a first half bridge output stage, a second half bridge output stage, a gate control circuit, a detection circuit, and a control logic. The first half bridge output stage comprises a first transistor and a second transistor connected in series between a power supply and a ground node. The second half bridge output stage comprises a first transistor and a second transistor connected in series between the power supply and the ground node. The gate control circuit is configured to output a first PWM signal for driving the first transistor and the second transistor of the first half bridge output stage, and output a second PWM signal for driving the first transistor and the second transistor of the second half bridge output stage. The detection circuit is configured to detect if a glitch event occurs in a gate voltage of one of the second transistor of the first half bridge output stage and the second transistor of the second half bridge output stage, and generate a set of control codes according to the detection. The control logic is configured to change delay time of the first PWM signal and the second PWM signal according to the set of control codes.

BRIEF DESCRIPTION OF THE DRAWINGS

The invention will be described according to the appended drawings in which.

DETAILED DESCRIPTION OF THE INVENTION

Figure 1:
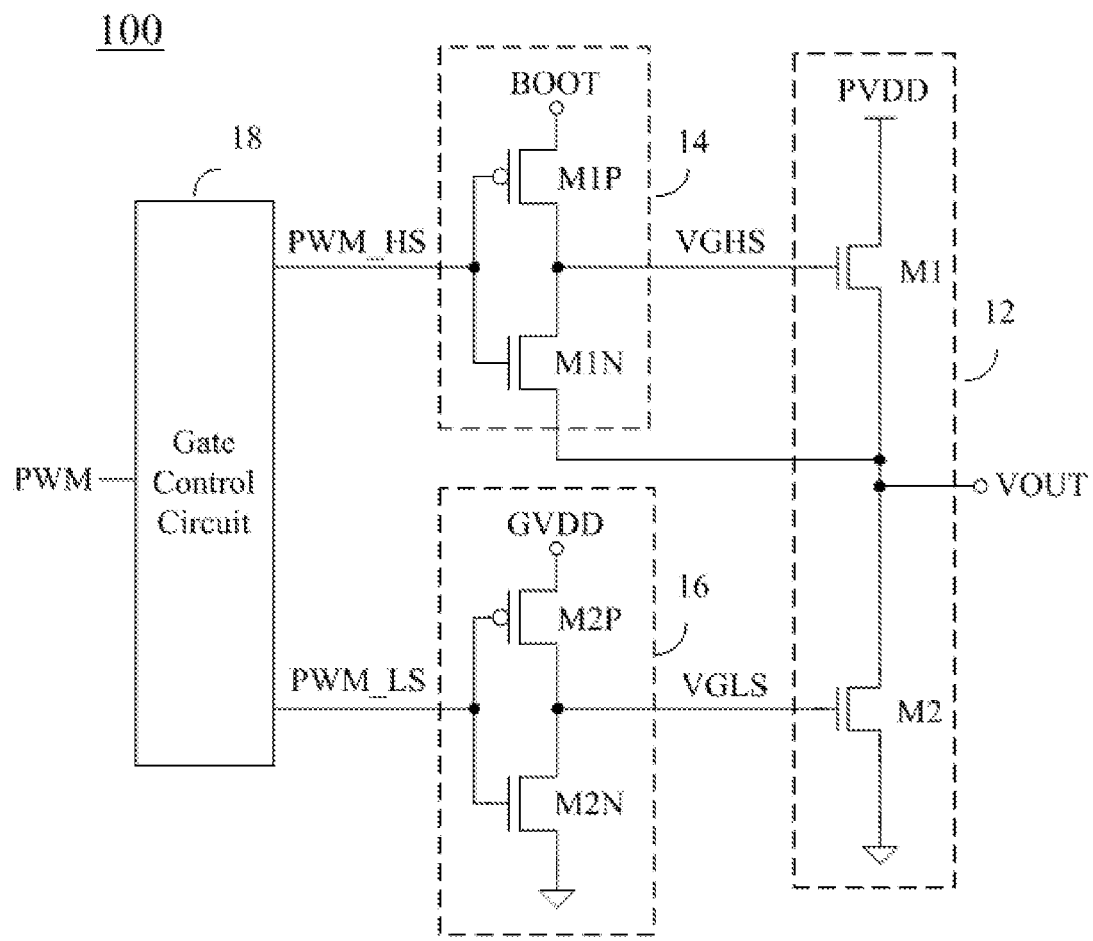
FIG. 1 shows a block diagram of a PWM output stage according to one embodiment of the present invention.

FIG. 1 shows a block diagram of a pulse width modulation (PWM) output stage 100 according to one embodiment of the present invention. Referring to FIG. 1, the PWM output stage 100 comprises a half bridge output stage 12, a high side driver 14, a low side driver 16, and a gate control circuit 18.

The half bridge output stage 12 comprises a NMOS transistor M1 and a NMOS transistor M2 connected in series between a power supply node PVDD and a ground node.

The high side driver 14 comprises a PMOS transistor M1P and a NMOS transistor M1N connected in series between a boot voltage node BOOT and an output terminal of the half bridge output stage 12. The high side driver 14 is connected to a gate of the NMOS transistor M1 for driving the NMOS transistor M1 in response to an output signal PWM_HS of the gate control circuit 18. The low side driver 16 comprises a PMOS transistor M2P and a NMOS transistor M2N connected in series between a supply voltage node GVDD and the ground node. The low side driver 16 is connected to a gate of the NMOS transistor M2 for driving the NMOS transistor M2 in response to an output signal PWM_LS of the gate control circuit 18.

Figure 2:
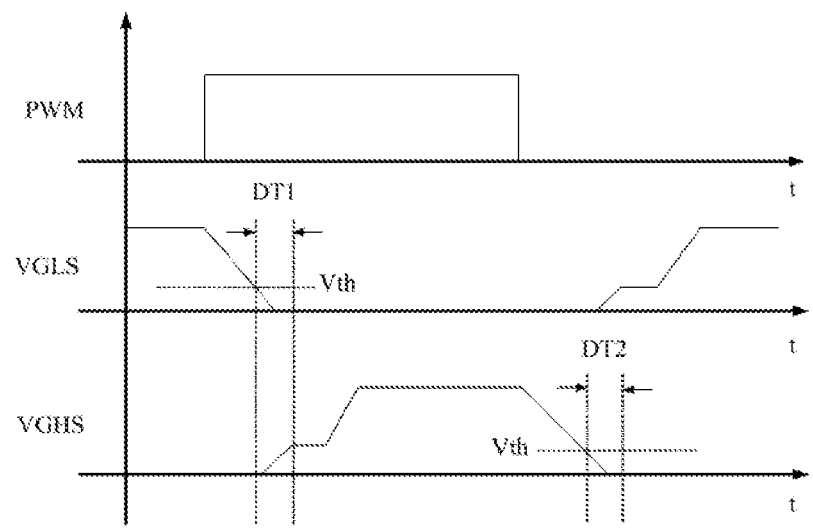
FIG. 2 shows a timing diagram illustrating a dead time between switching transistors according to one embodiment of the present invention.

FIG. 2 shows a timing diagram 200 illustrating a dead time between switching transistors according to one embodiment of the present invention. Referring to FIG. 2, dead time interval DT1 is set between turning on a low side transistor such as the NMOS transistor M2 and turning on a high side transistor such as the NMOS transistor M1 of FIG. 1, and dead time interval DT2 is set between turning on a high side transistor such as the NMOS transistor M1 and turning on a low side transistor such as the NMOS transistor M2 of FIG. 1. When the gate voltage VGLS of the transistor M2 rises above a threshold Vth, the NMOS transistor M2 is in an on state; and when the gate voltage VGHS of the transistor M1 rises above a threshold VOUT+Vth, the NMOS transistor M1 is in an on state. The transistors M1 and M2 are in off states in the dead time interval DT1 and the dead time interval DT2.

Figure 3A:
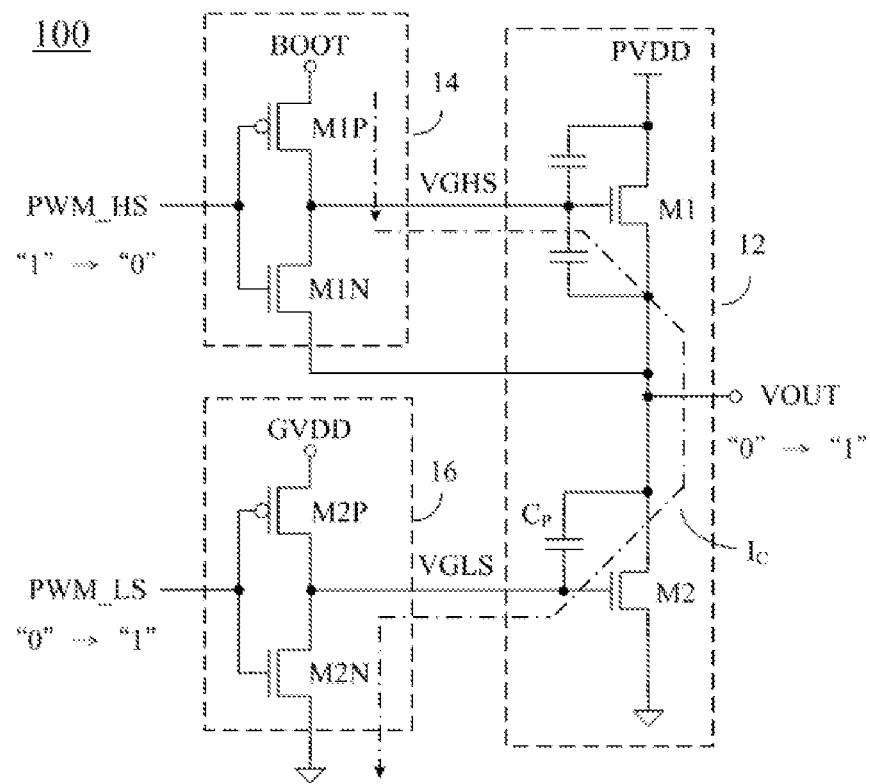
FIG. 3A shows the impact of the dead time interval on the gate voltage of the switching transistor.
Figure 3B:
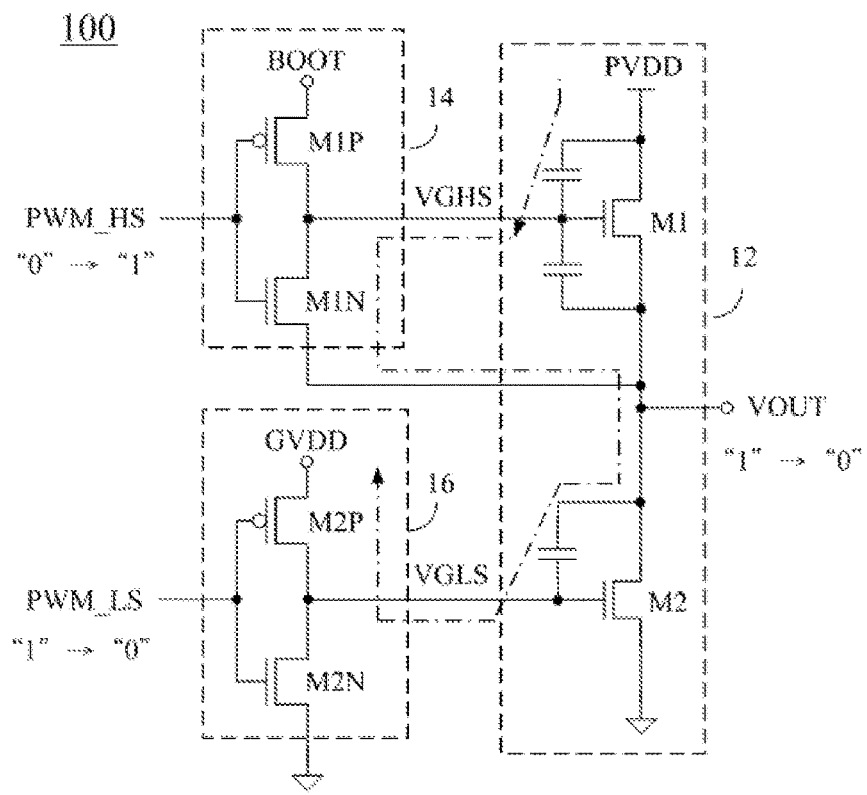
FIG. 3B shows the impact of the dead time interval on the gate voltage of the switching transistor.
Figure 3C:
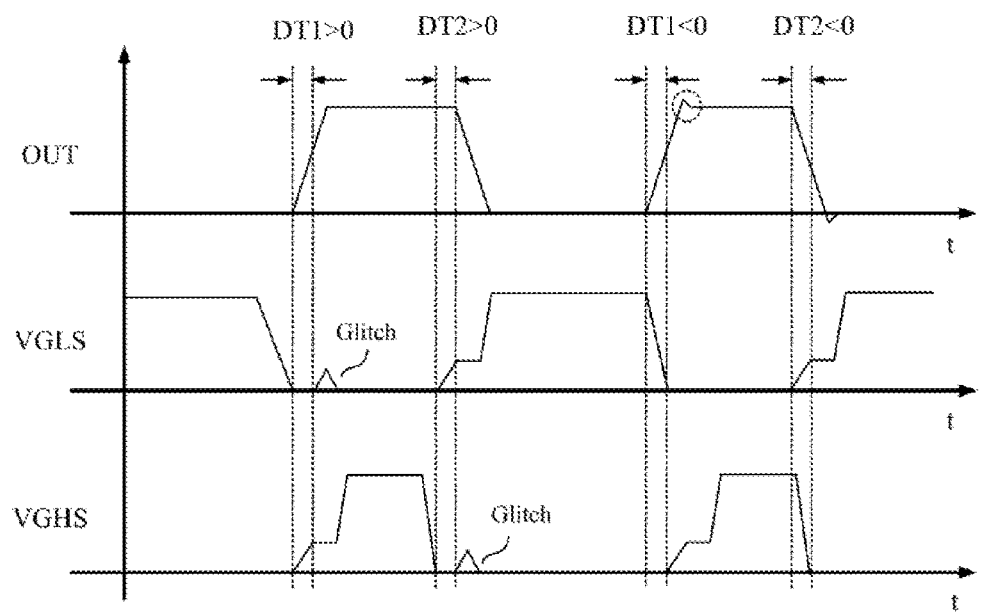
FIG. 3C shows the impact of the dead time interval on the gate voltage of the switching transistor.

FIG. 3A, FIG. 3B, and FIG. 3C show the impact of the dead time interval on the gate voltage of the switching transistor. Referring to FIG. 3A and FIG. 3C, if the dead time interval DT1<0, the transistors M1 and M2 of the half bridge output stage 12 may turn on simultaneously, that is, there will be a current shoot-through through the transistors M1 and N2 and a voltage spike occurs, damaging the transistors M1 and M2. If the dead time interval DT1>0, a short pulse or glitch occurs in the gate voltage VGLS of the transistor M2. The glitch is generated because a charge current $I_C$ is formed when the transistors M1P and M2N turn on. The charge current $I_C$ charges a parasitic capacitor $C_P$ to generates the glitch in the gate voltage VGLS of the transistor M2. That is, the gate voltage VGLS of the transistor M2 rises to a set voltage and then falls to the ground voltage for a short time. The similar condition occurs in the gate voltage VGHS of the transistor M1 if the dead time interval DT2>0 as shown in FIG. 3B and FIG. 3C. Therefore, a proper dead time control can be obtained by monitoring the gate voltage VGLS of the transistor M2 and/or the gate voltage VGHS of the transistor M1. The dead time control is obtained by monitoring the gate voltage VGLS of the transistor M2 in the following embodiments. However, it does not mean to limit the present invention. The following embodiments are only implementation examples of the present invention. The scope of the present invention should base on claims illustrated herein after.

Figure 4:
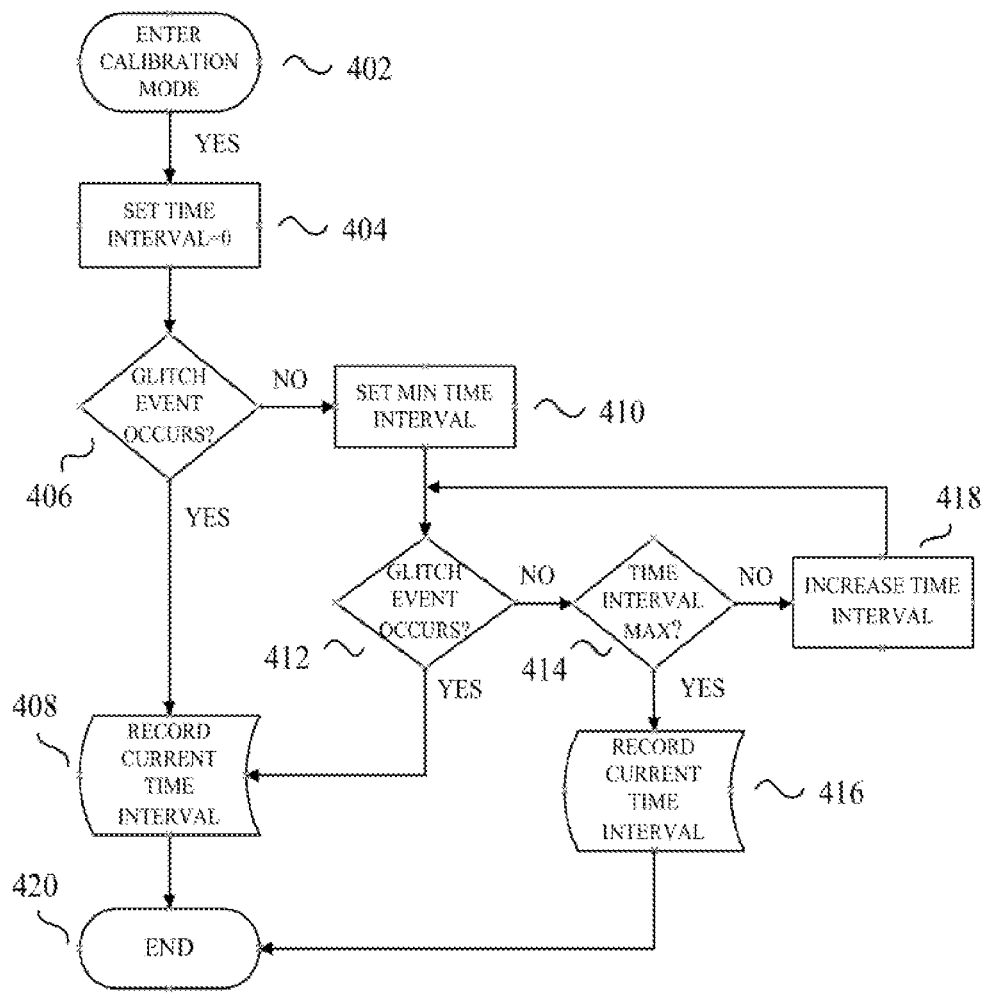
FIG. 4 describes the procedure of a method for controlling the dead time of the transistor of the PWM output stage shown in FIG. 1.

In order to enable those skilled in the art to practice the present invention in accordance with the exemplary embodiment, FIG. 4 is utilized to describe the procedure of a method for controlling the dead time of the transistor M2 of the PWM output stage 100 shown in FIG. 1. Provided that substantially the same result is achieved, the steps of the flowchart shown in FIG. 4 need not be in the exact order shown and need not be contiguous, that is, other steps can be intermediate.

At 402, the PWM output stage 100 enters a calibration mode. When the PWM output stage 100 enters the calibration mode, a time interval is set to 0 first. When the transistor M2 is in an off state, at 406, a check is made to determine if a glitch event occurs in the gate voltage VGLS of the transistor M2. If so, at 408, the current time interval is recorded. If not, at 410, a minimum time interval is set. When the transistor M2 is in the off state again, at 412, a check is made to determine if the glitch event occurs in the gate voltage VGLS of the transistor M2. If so, at 408, the current time interval is recorded. If not, at 414, a check is made to determine if the time interval reaches its maximum value. If so, at 416, the current time interval is recorded. If not, at 418, the value of the time interval is increased. This flow through steps 412, 414 and 418 will repeat until the glitch event occurs in the gate voltage VGLS of the transistor M2.

Figure 5:
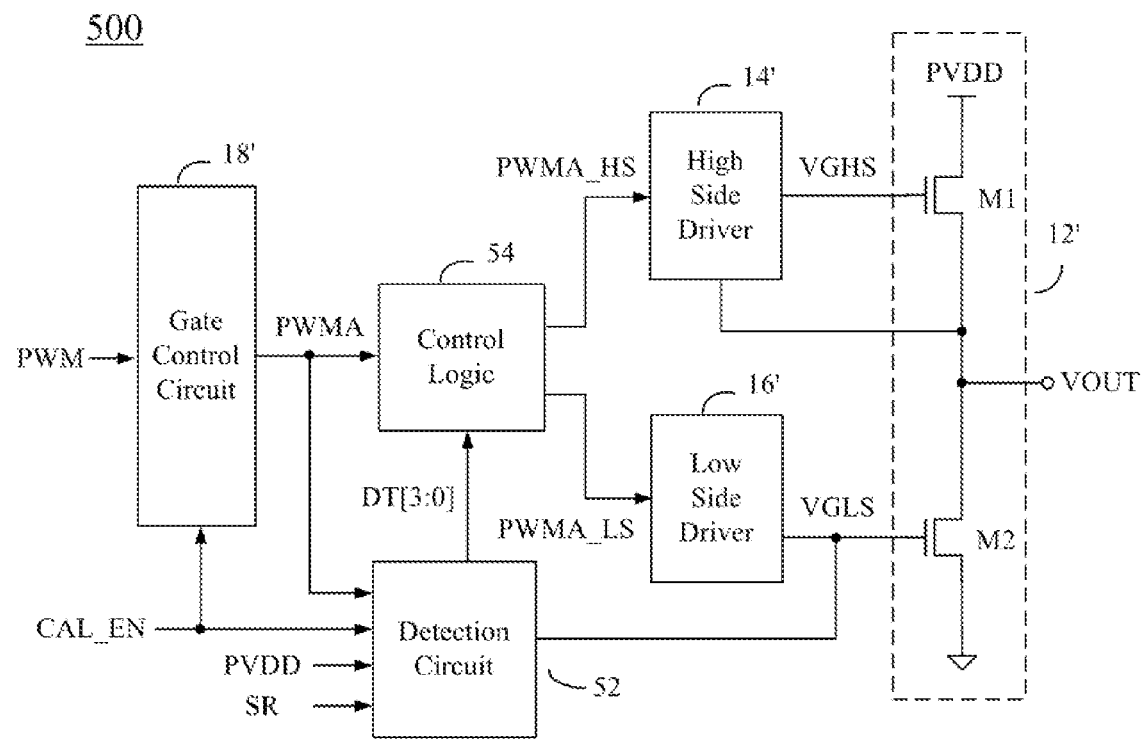
FIG. 5 shows a block diagram of a PWM output stage according to one embodiment of the present invention.

The details of the flow for controlling the dead time of the present invention will be described below with respect to FIG. 5 and FIG. 6. FIG. 5 shows a block diagram of a PWM output stage 500 according to one embodiment of the present invention. Referring to FIG. 5, the PWM output stage 500 comprises a half bridge output stage 12', the high side driver 14', the low side driver 16', a detection circuit 52, a control logic 54, and a gate control circuit 18'. Components having similar functions to those in FIG. 1 are denoted by the same reference numerals and detailed descriptions thereof will be omitted.

Figure 6:
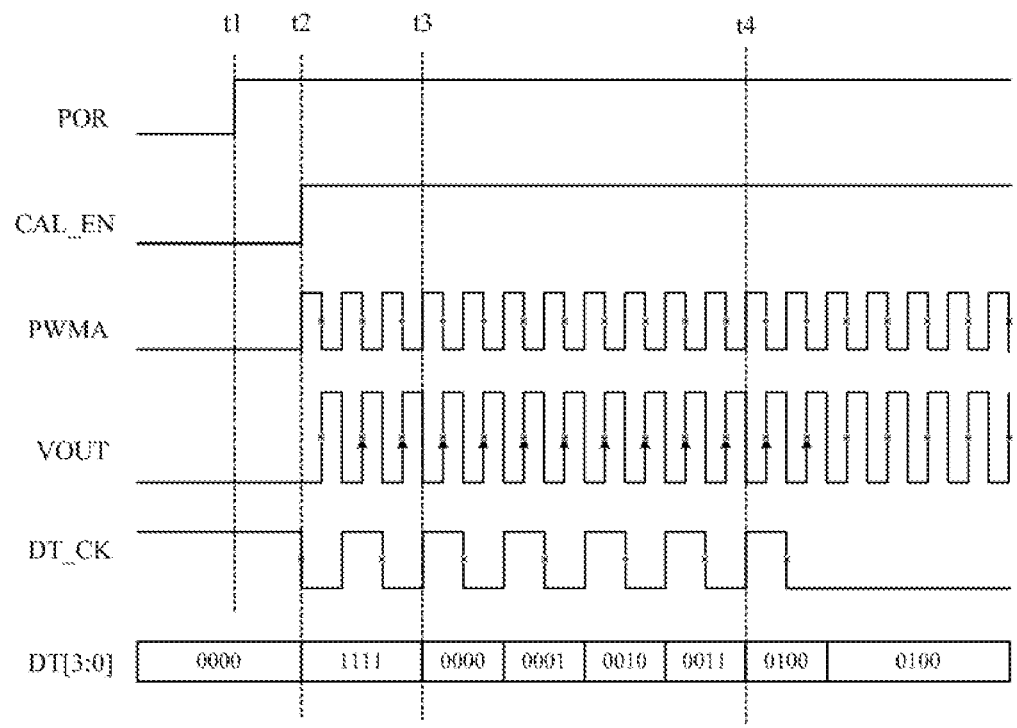
FIG. 6 shows a timing diagram illustrating the operation of the PWM output stage.

Referring to FIG. 5 and FIG. 6, when a power supply is activated at t1, a power on reset signal POR transits from a logic low state to a logic high state. At t2, a calculation signal CAL_EN is initially reset to a logic high state so that the PWM output stage 500 enters a calculation mode. When the PWM output stage 500 enters the calculation mode, the gate control circuit 18' repeatedly generates an output signal PWMA having a duty cycle of 50%, that is, the output signal PWMA is high and low for equal periods of time.

After receiving the calculation signal CAL_EN, the detection circuit 52 resets control codes DT[3:0] to [1 1 1 1] so that the phase difference or time difference between an output signal PWMA_HS of the control logic 54 and an output signal PWMA of the gate control circuit 18' is almost zero (the same phase). The output signals PWMA_HS and PWMA_LS are complementary in this embodiment. Therefore, the output signal VOUT of the half bridge output stage 12' is at logic low when the signal PWMA is at logic high; and the output signal VOUT of the half bridge output stage 12' is at logic high when the signal PWMA is at logic low.

Then, the detection circuit 52 detects if a glitch event occurs in the gate voltage VGLS of the transistor M2 when the transistor M2 is in an off state. If so, the control codes [3:0]=[1 1 1 1] are recorded for using in a normal operation mode. If not, at t3, the detection circuit 52 sets the control codes DT[3:0] to [0 0 0 0] which provides the minimum time interval, e.g. 1ns, between the output signal PWMA_LS of the control logic 54 and the output signal PWMA of the gate control circuit 18'.

Then, the detection circuit 52 continuously detects if a glitch event occurs in the gate voltage VGLS of the transistor M2 when the transistor M2 is in the off state. If so, the current control codes [3:0] are recorded for using in the normal operation mode after the calculation mode. If not, a check is made to determine if the control codes DT[3:0] reaches its maximum value. That is, the time interval between the output signal PWMA_LS of the control logic 54 and the output signal PWMA of the gate control circuit 18' reaches the maximum value.

When the control codes DT[3:0] reaches its maximum value, the current control codes [3:0] are recorded for using in the normal operation mode. Otherwise, the detection circuit 52 increases the control codes DT[3:0] to increase the time interval. Every time the control codes DT[3:0] change, the detection circuit 52 detects if the glitch event occurs in the gate voltage VGLS of the transistor M2. Once the glitch event occurs in the gate voltage VGLS of the transistor M2, the control codes DT[3:0] stops changing, which means the time interval is sufficient. In this embodiment, at t4, the detection circuit 52 outputs the control codes DT[3:0]=[0 1 0 0] to the control logic 54 so that the time interval between the output signal PWMA_LS of the control logic 54 and the output signal PWMA of the gate control circuit 18' is update to, e.g. 3 ns. The detection circuit 52 continuously detects the gate voltage VGLS of the transistor M2. If the glitch event occurs in the gate voltage VGLS of the transistor M2, it means the time interval is sufficient. Therefore, the current control codes [3:0]=[0 1 0 0] are recorded for using in the following normal operation mode.

When the calculation signal CAL_EN is set to a logic low state, the PWM output stage 500 enters the normal operation mode from the calculation mode. At this time, the detection circuit 52 stops the operation, and the gate control circuit 18' stops repeatedly generating the output signal PWMA having a duty cycle of 50%. The gate control circuit 18' operates according to a pulse width modulation signal PWM. The time interval between the output signal PWMA_LS of the control logic 54 and the output signal PWMA of the gate control circuit 18' is determined according to the current control codes DT[3:0] recorded in the calculation mode. Therefore, reliable prevention of simultaneous conduction by the two transistors M1 and M2 is achieved by the recoded control codes DT[3:0].

Figure 7A:
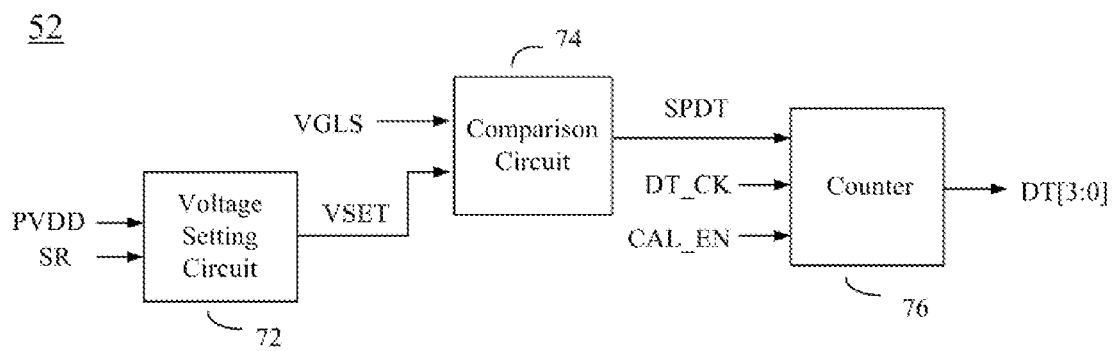
FIG. 7A shows a schematic view of the detection circuit according to one embodiment of the present invention.

FIG. 7A shows a schematic view of the detection circuit 52 according to one embodiment of the present invention. Referring to FIG. 7A, the detection circuit 52 comprises a voltage setting circuit 72, a comparison circuit 74, and a counter 76. The voltage setting circuit 72 is configured to generate a preset voltage VSET. The comparison circuit 74 compares the gate voltage VGLS of the transistor M2 with the preset voltage VSET to generate a comparison result SPDT. The counter 76 is configured to generate the control codes DT[3:0] according the comparison result SPDT, the signal CAL_EN, and a clock signal DT_CK.

Figure 7B:
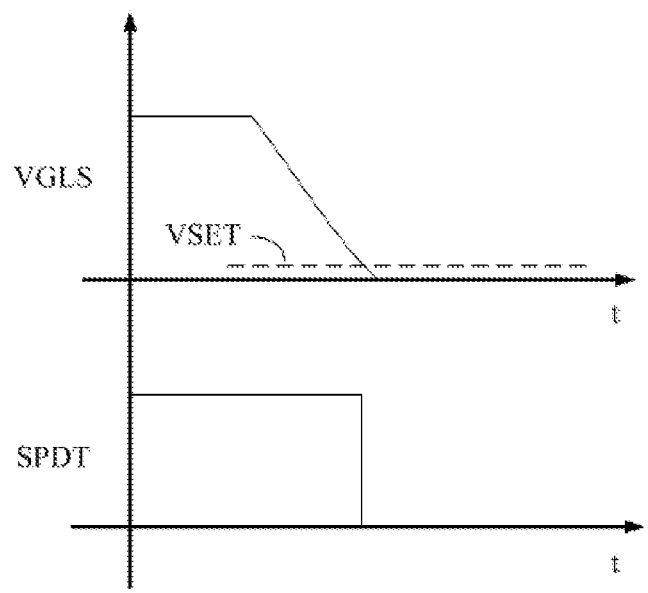
FIG. 7B shows a timing diagram of the gate voltage of the transistor and the comparison result in the case where the dead time interval <0.

FIG. 7B shows a timing diagram of the gate voltage VGLS of the transistor M2 and the comparison result SPDT in the case where the dead time interval <0. In this case, the gate voltage VGLS of the transistor M2 in FIG. 5 drops from the supply voltage GVDD to ground when the transistor M2 is in the off state. Therefore, the comparison result SPDT transits from a logic high state to a logic low state.

Figure 7C:
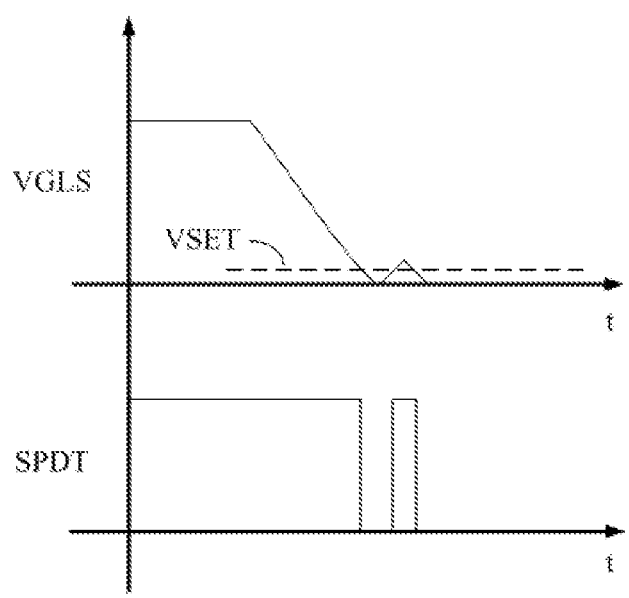
FIG. 7C shows a timing diagram of the gate voltage of the transistor and the comparison result in case where the dead time interval >0.

FIG. 7C shows a timing diagram of the gate voltage VGLS of the transistor M2 and the comparison result SPDT in case where the dead time interval >0. In this case, when the transistor M2 is in the off state, the gate voltage VGLS of the transistor M2 drops from the supply voltage GVDD, and then rises above the preset voltage VSET because a charge current $I_C$ charges the parasitic capacitor, and finally the gate voltage VGLS drops to the ground. Therefore, the comparison result SPDT has a logical high-low-high-low transition sequence Referring to FIG. 6 and FIG. 7C, new control codes DT[3:0] generate at the rising edges of the clock signal DT_CK. When the detection circuit 52 detects that a glitch event occurs in the gate voltage VGLS of the transistor M2, the comparison result SPDT has a logical high-low-high-low transition sequence. More than two transition states make the counter 76 stop counting, so that the control codes DT[3:0] latch in the current values.

Figure 8:
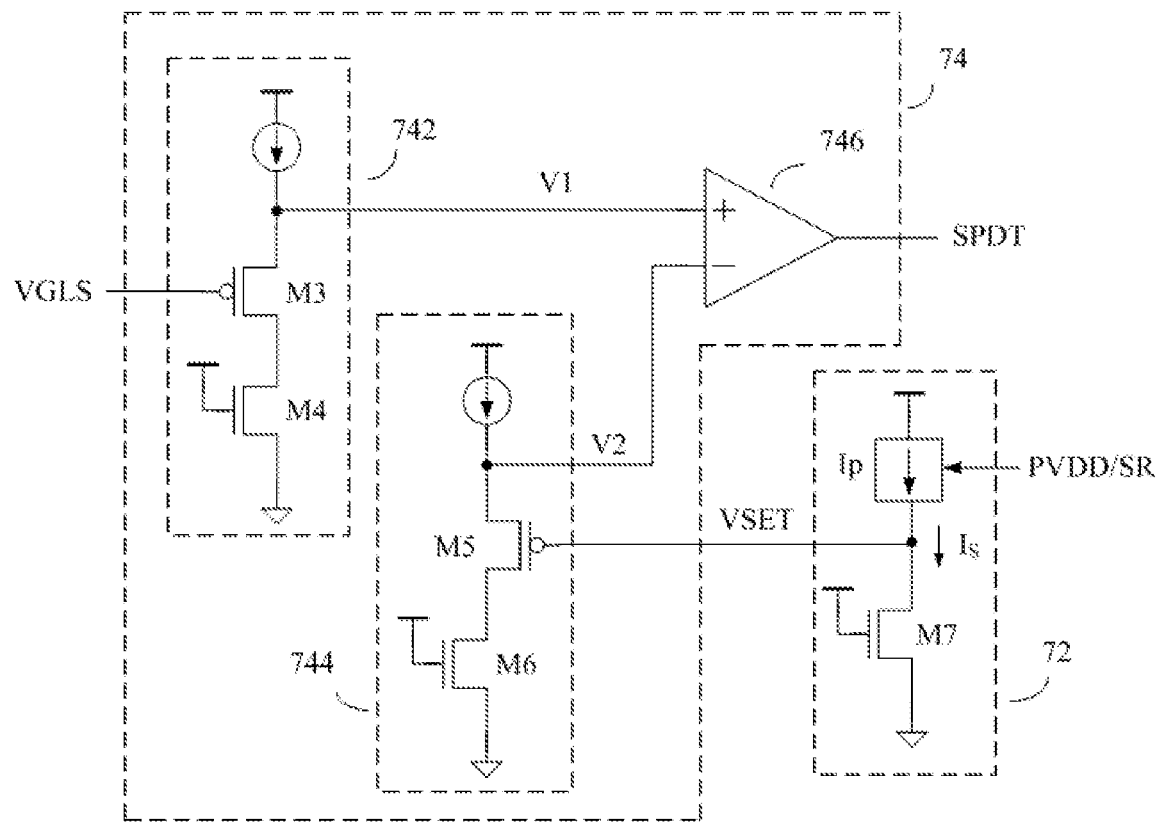
FIG. 8 shows a circuit diagram of the voltage setting circuit and the comparison circuit of the detection circuit according to one embodiment of the present invention.

FIG. 8 shows a circuit diagram of the voltage setting circuit 72 and the comparison circuit 74 of the detection circuit 52 according to one embodiment of the present invention. Referring to FIG. 8, the comparison circuit 74 comprises voltage level shifters 742 and 744, and a comparator 746. The voltage level shifter 742 is used to increase voltage level of the gate voltage VGLS, and the voltage level shifter 744 is used to increase voltage level of the preset voltage VSET. The comparator 746 compares voltage V1 with voltage V2 to generate the comparison result SPDT.

The voltage setting circuit 72 comprises a programmable current source Ip and a transistor M7. The transistor M7 is used as a resistor. The value of the current source Ip is determined by the voltage level of the supply voltage PVDD and slew rate set codes SR. The current of the current source Ip flows through the transistor M7 to form the preset voltage VSET. Therefore the preset voltage VSET can be obtained by equation (1):

$$VSET = N \times Is \times rM7 \qquad (1)$$

The value N is related to the voltage level of the supply voltage PVDD and the slew rate set codes SR. Is is the value of the current source Ip, and rM7 is the equivalent resistance of the transistor M7.

Referring to FIG. 3A, when the output signal PWMA_HS transits to a logic low state and the output signal PWMA_LS transits to a logic high state, the charge current $I_C$ charges the parasitic capacitor $C_P$ so that the gate voltage VGLS of the transistor M2 rises. Therefore, the gate voltage VGLS can be can be obtained by equation (2):

$$VGLS = Ic \times rM2N \qquad (2)$$

rM2N is the equivalent resistance of the transistor M2N.

Referring to FIG. 8, when the voltage VGLS is larger than the preset voltage VSET, the comparator 746 generates the comparison result SPDT. Therefore, the value Is of the current source Ip can be obtained by equations (1) and (2):

$$Is = Ic \times \frac{1}{N} \times \frac{rM2N}{rM7} \qquad (3)$$

According to equation (3), the value Is can be adjusted by the ratio of the equivalent resistance of the transistor M2N to the equivalent resistance of the transistor M7.

In another embodiment of the present invention, since the voltage level of the voltage BOOT is equal to the sum of the voltage PVDD and an increment, the value Is adjusts the value N according to the increment. In yet another embodiment, the value N increases with a larger slew rate. This is because that larger slew rate indicates higher driving ability for the transistor M1P in FIG. 3, and larger charge current $I_C$ accompanies higher driving ability. Therefore, the value N increases so that the voltage VGLS can be equal to the voltage VSET in case of larger slew rate. In summary, the value of the preset voltage VSET is adjusted according to the variation of the high side driver and the low side driver, such as the voltage level of the voltage BOOT and the slew rate variation, so as to truly response the variation of the gate voltage VGLS of the transistor M2.

Figure 9:
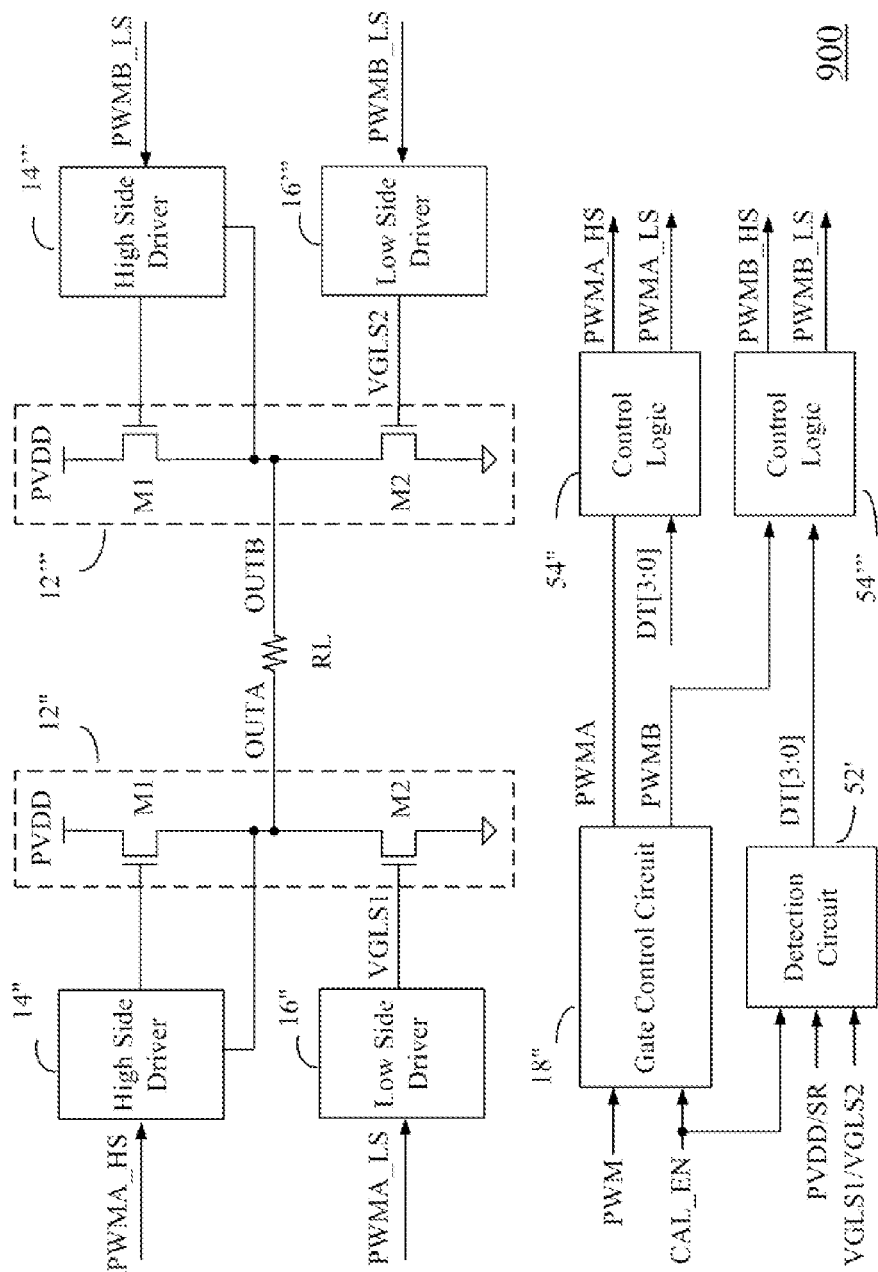
FIG. 9 shows a block diagram of a PWM output stage according to one embodiment of the present invention.

The PWM output stage 500 in FIG. 5 comprises the half bridge output stage 12'. However, the PWM output stage can have configuration of a full bridge connection. FIG. 9 shows a block diagram of a PWM output stage 900 according to one embodiment of the present invention. Referring to FIG. 9, the PWM output stage 900 comprises a first half bridge output stage 12", a second half bridge output stage 12''', a detection circuit 52', a control logic 54'', a control logic 54''', and a gate control circuit 18''. Components having similar functions to those in FIG. 5 are denoted by the same reference numerals and detailed descriptions thereof will be omitted.

The gate control circuit 18'' receives an input signal PWM to generate output signals PWMA and PWMB. The control logic 54'' receives the output signal PWMA to generate complementary output signals PWMA_HS and PWMA_LS according to control codes DT[3:0]. The output signal PWMA_HS transmits to a high side driver 14'' to drive a NMOS transistor M1 of the first half bridge output stage 12'', and the output signal PWMA_LS transmits to a low side driver 16'' to drive a NMOS transistor M2 of the first half bridge output stage 12''.

The control logic 54''' receives the output signal PWMB to generate complementary output signals PWMB_HS and PWMB_LS according to the control codes DT[3:0]. The output signal PWMB_HS transmits to a high side driver 14''' to drive a NMOS transistor M1 of the second half bridge output stage 12''', and the output signal PWMB_LS transmits to a low side driver 16''' to drive a NMOS transistor M2 of the first half bridge output stage 12'''.

Figure 10:
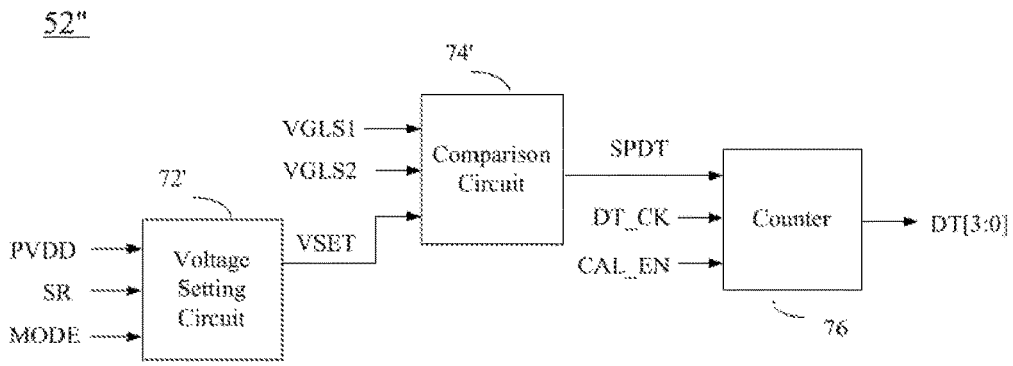
FIG. 10 shows a schematic view of the detection circuit according to one embodiment of the present invention.

FIG. 10 shows a schematic view of the detection circuit 52' according to one embodiment of the present invention. Referring to FIG. 10, the detection circuit 52' comprises a voltage setting circuit 72', a comparison circuit 74', and a counter 76. The difference between the voltage setting circuit 72' and the voltage setting circuit 72 in FIG. 7 is that the voltage setting circuit 72' receives an input signal MODE, wherein the input signal MODE indicates that the PWM output stage 900 operates in the AD mode or BD mode during the normal operation.

Figure 11A:
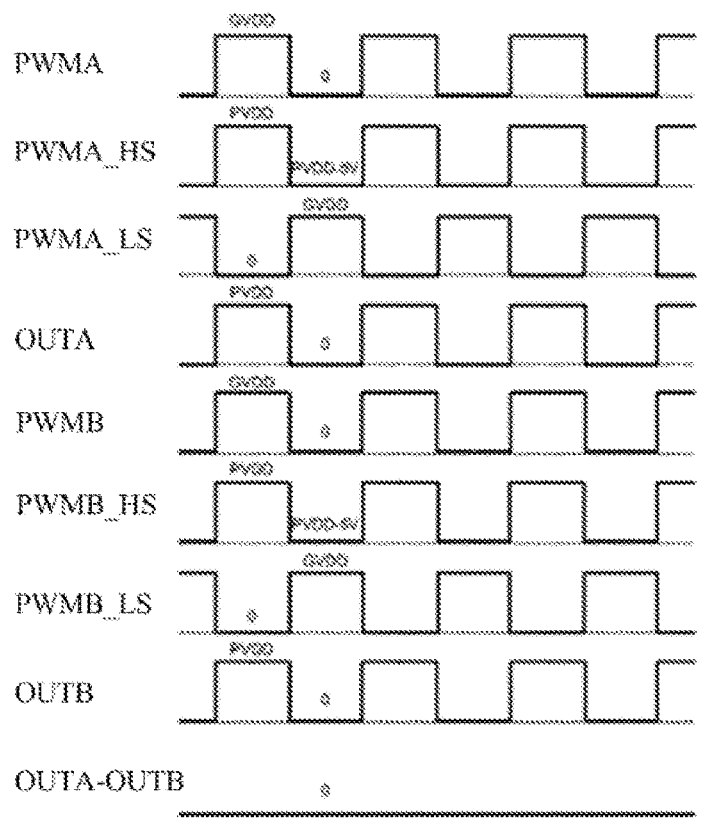
FIG. 11A show output signals of the PWM output stage in the AD mode.
Figure 11B:
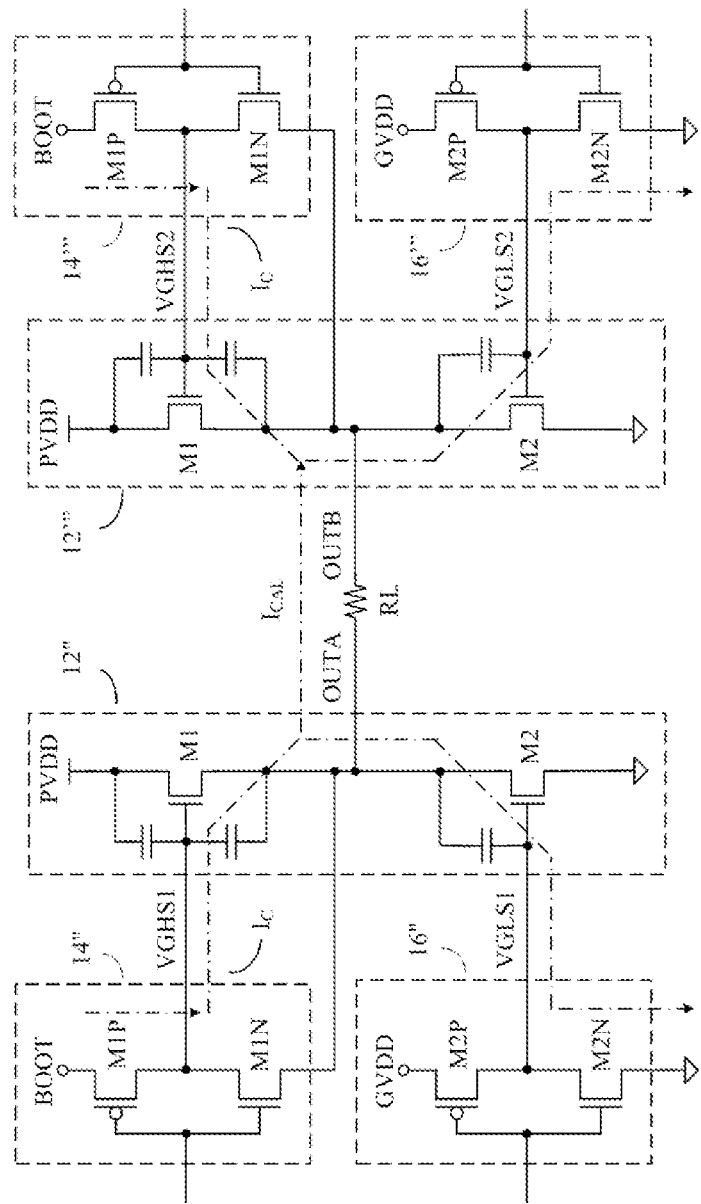
FIG. 11B show the current flowing through the load, the first half bridge output stage, and the second half bridge output stage in the AD mode.
Figure 12A:
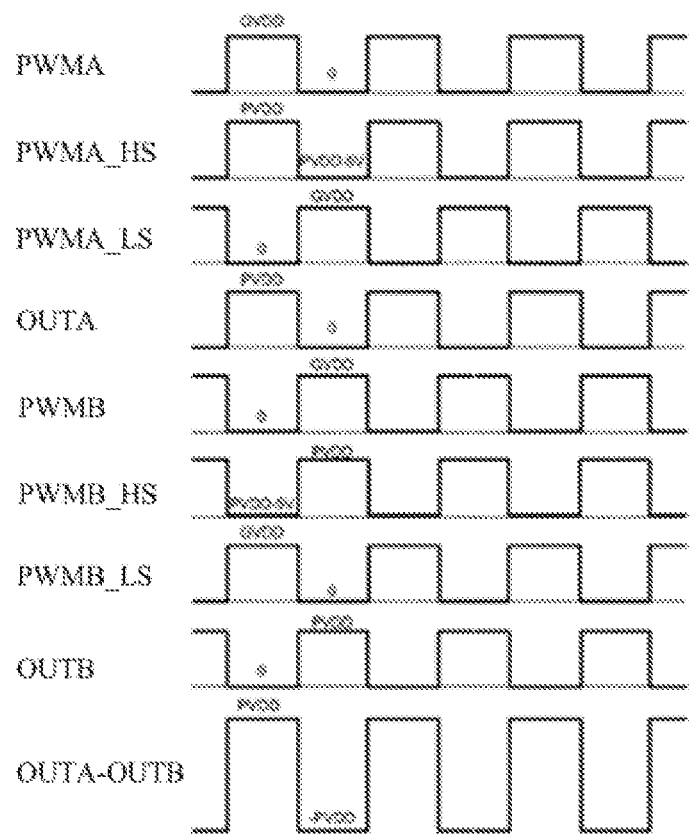
FIG. 12A show output signals of the PWM output stage in the BD mode.
Figure 12B:
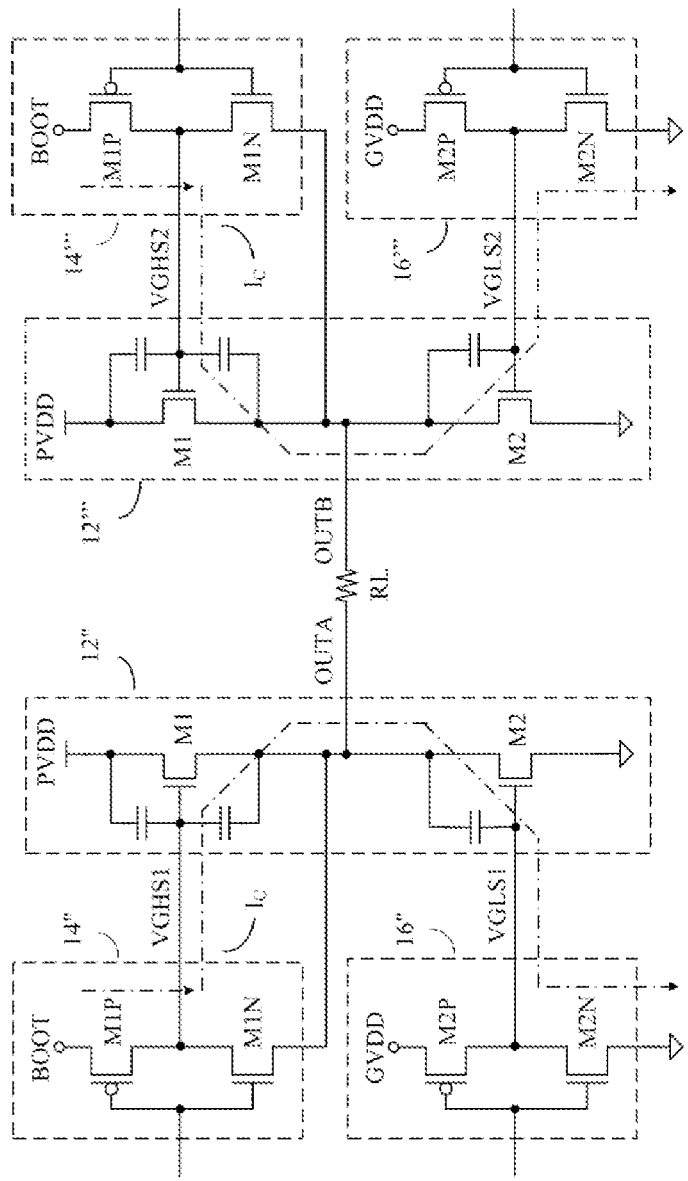
FIG. 12B show the current flowing through the load, the first half bridge output stage, and the second half bridge output stage in the BD mode.

Referring to FIGS. 11A and 11B, when the PWM output stage 900 operates in the AD mode, the signal at the output terminal OUTA is in inverse phase with respect to the signal at the output terminal OUTB. Therefore, in the case where the input signal of the PWM output stage 900 is zero, the signal obtained across the load RL, e.g. a speaker, is a zero signal. Referring to FIGS. 12A and 12B, when the PWM output stage 900 operates in the BD mode, the signal at the output terminal OUTA is in phase with respect to the signal at the output terminal OUTB. Therefore, in the case where the input signal of the PWM output stage 900 is zero, the signal obtained across the load is a differential signal.

Referring to FIGS. 11B and 12B, when the PWM output stage 900 enters the calculation mode, the gate control circuit 18'' of FIG. 10 repeatedly generates output signals PWMA and PWMB having a duty cycle of 50%. However, since the conduction of the transistors of the first half bridge output stage 12'' and the second half bridge output stage 12''' is different in the AD mode and BD mode, the voltage setting circuit 72' in FIG. 10 generates a different preset voltage VSET according to the input signal MODE. In the case of the AD mode, a current $I_{CAL}$ flows through the load RL when the PWM output stage 900 enters the calculation mode. In the case of the BD mode, no current flows through the load RL when the PWM output stage 900 enters the calculation mode. Therefore, the preset voltage VSET in the AD mode is lower than the preset voltage VSET in the BD mode.

Figure 13:
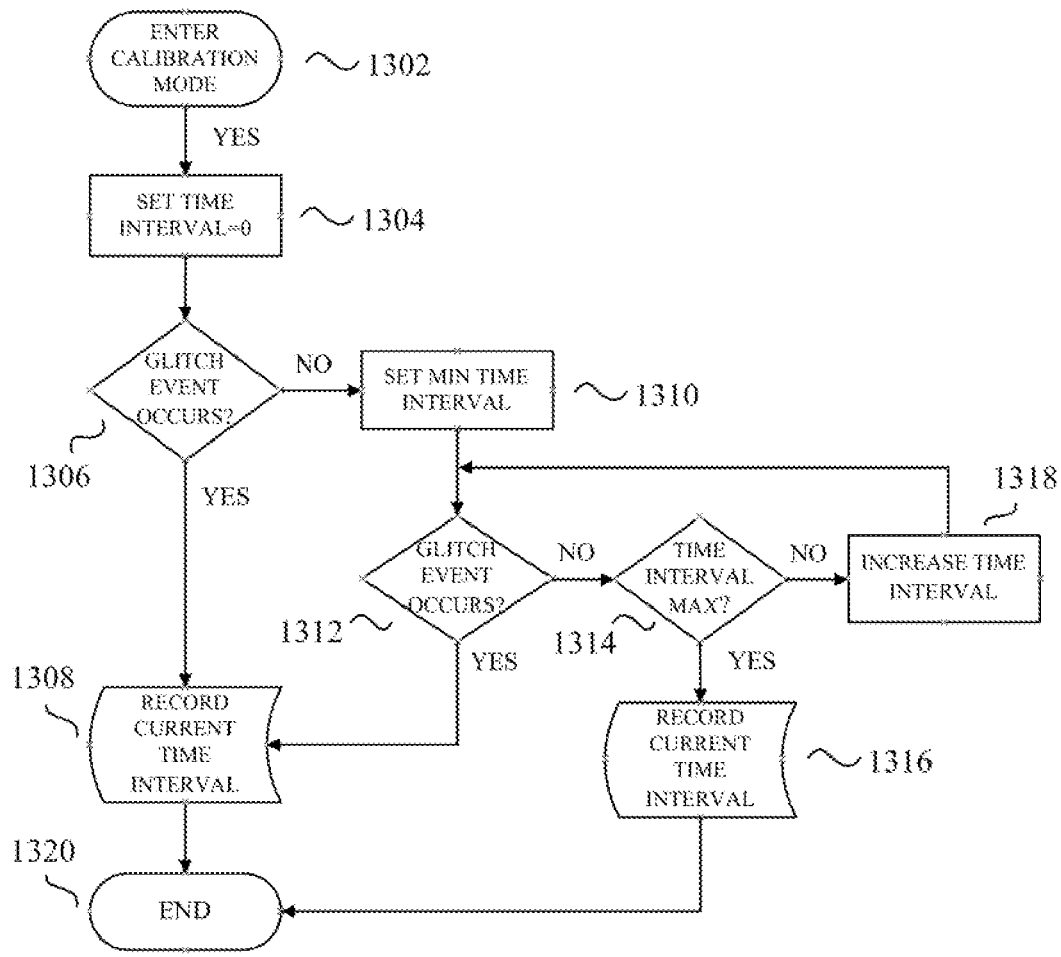
FIG. 13 describes the procedure of a method for controlling the dead time of the PWM output stage shown in FIG. 9 and FIG. 10.

In the calculation mode, the dead time control method and circuits of the PWM output stage 900 are similar to those of the PWM output stage 500 in FIG. 5. In order to enable those skilled in the art to practice the present invention in accordance with the exemplary embodiment, FIG. 13 is utilized to describe the procedure of a method for controlling the dead time of the PWM output stage 900 shown in FIG. 9 and FIG. 10. Procedures in FIG. 13 having similar functions to those in FIG. 13 are denoted by the same reference numerals and detailed descriptions thereof will be omitted, and procedures in FIG. 9 and FIG. 10 having similar functions to those in FIG. 5 and FIG. 7 are denoted by the same reference numerals and detailed descriptions thereof will be omitted At 1302, the PWM output stage 900 enters a calibration mode. When the PWM output stage 900 enters the calibration mode, a time interval is set to 0 first at 1304. That is, the phase difference or time difference between an output signal PWMA_HS of the control logic 54'' and an output signal PWMA of the gate control circuit 18' is zero, and the phase difference or time difference between an output signal PWMB_HS of the control logic 54''' and an output signal PWMB of the gate control circuit 18' is zero.

At 1306, a check is made to determine if a glitch event occurs in the gate voltage VGLS1 of the transistor M2 of the first half bridge output stage 12'' and a glitch event occurs in the gate voltage VGLS2 of the transistor M2 of the second half bridge output stage 12'''. If both occur, at 1308, the current time interval is recorded. If no glitch event occurs or only one glitch event occurs, at 1310, a minimum time interval is set. In one embodiment, the detection circuit 52 sets the control codes DT[3:0] to [0 0 0 0] which provides the minimum time interval, e.g. 1 nsec, between the output signal PWMA_LS of the control logic 54'' and the output signal PWMA of the gate control circuit 18'

At 1312, a check is made to determine if the glitch event occurs in the gate voltage VGLS1 of the transistor M2 of the first half bridge output stage 12'' and the glitch event occurs in the gate voltage VGLS2 of the transistor M2 of the second half bridge output stage 12'''. If so, at 1308, the current time interval is recorded. If not, at 1314, a check is made to determine if the time interval reaches its maximum value. If so, at 1316, the current time interval is recorded. If not, at 1318, the value of the time interval is increased. This flow through steps 1312, 1314 and 1318 will repeat until the glitch event occurs in the gate voltage VGLS1 of the transistor M2 of the first half bridge output stage 12'' and the glitch event occurs in the gate voltage VGLS2 of the transistor M2 of the second half bridge output stage 12'''.

If both glitch event occur, it indicates the dead time interval of the transistors M1 and M2 of the first half bridge output stage 12''>0, and the dead time interval of the transistors M1 and M2 of the second half bridge output stage 12'''>0. Therefore, the transistors M1 and M2 of the first half bridge output stage 12'' do not turn on simultaneously, and the transistors M1 and M2 of the second half bridge output stage 12''' do not turn on simultaneously. In this manner, a shoot-through current through the transistors M1 and M2 is reduced.

The above-described embodiments of the present invention are intended to be illustrative only. Numerous alternative embodiments may be devised by those skilled in the art without departing from the spirit and scope of the invention as recited in the following claims.

What is claimed is:

1. A pulse width modulation (PWM) output stage, comprising:
   a half bridge output stage comprising a first transistor and a second transistor connected in series between a power supply and a ground node;
   a gate control circuit configured to output a PWM signal for driving the first transistor and the second transistor;

a detection circuit configured to detect if a glitch event occurs in a gate voltage of one of the first transistor and second transistor when the second transistor is in an off state, and generate a set of control codes according to the detection; and a control logic configured to change delay time of the PWM signal according to the set of control codes.

2. The PWM output stage of claim 1, wherein the detection circuit comprises:

a voltage setting circuit configured to generate a preset voltage;

a comparison circuit configured to compare the gate voltage of one of the first transistor and second transistor with the preset voltage; and s counter configured to generate the set of control codes according to a comparison result of the comparison circuit.

3. The PWM output stage of claim 2, wherein the detection circuit and the control logic enter a calculation mode according to a calculation enable signal, and the control logic stores the set of the control codes in the calculation mode so that the PWM output stage uses the set of the control codes to change the delay time of the of the PWM signal in a normal operation mode.

4. The PWM output stage of claim 2, wherein the voltage setting circuit comprises:

a programmable current source; and a resistor;

wherein the current of the programmable current source flows through the resistor to generate the preset voltage.

5. The PWM output stage of claim 4, wherein programmable current source changes the value according to the power supply.

6. The PWM output stage of claim 4, wherein programmable current source changes the value according to a slew rate.

7. A pulse width modulation (PWM) output stage, comprising:

a first half bridge output stage comprising a first transistor and a second transistor connected in series between a power supply and a ground node;

a second half bridge output stage comprising a first transistor and a second transistor connected in series between the power supply and the ground node;

a gate control circuit configured to output a first PWM signal for driving the first transistor and the second transistor of the first half bridge output stage, and output a second PWM signal for driving the first transistor and the second transistor of the second half bridge output stage;

a detection circuit configured to detect if a glitch event occurs in a gate voltage of one of the second transistor of the first half bridge output stage and the second transistor of the second half bridge output stage, and generate a set of control codes according to the detection; and a control logic configured to change delay time of the first PWM signal and the second PWM signal according to the set of control codes.

8. The PWM output stage of claim 7, wherein the detection circuit comprises:

a voltage setting circuit configured to generate a preset voltage;

a comparison circuit configured to compare the gate voltage of one of the second transistor of the first half bridge output stage and the second transistor of the second half bridge output stage with the preset voltage; and s counter configured to generate the set of control codes according to a comparison result of the comparison circuit.

9. The PWM output stage of claim 8, wherein the detection circuit and the control logic enter a calculation mode according to a calculation enable signal, and the control logic stores the set of the control codes in the calculation mode so that the PWM output stage uses the set of the control codes to change the delay time of the first PWM signal and the second PWM signal in a normal operation mode.

10. The PWM output stage of claim 8, wherein the voltage setting circuit comprises:

a programmable current source; and a resistor;

wherein the current of the programmable current source flows through the resistor to generate the preset voltage.

11. The PWM output stage of claim 10, wherein programmable current source changes the value according to the power supply.

12. The PWM output stage of claim 10, wherein programmable current source changes the value according to a slew rate.

13. The PWM output stage of claim 10, wherein programmable current source changes the value according to a mode signal, wherein the mode signal indicates whether the PWM output stage operates in an AD mode or a BD mode.

* * * * *